(12) United States Patent
Wooliscroft (10) Patent No.: US 9,514,624 B2
(45) Date of Patent: Dec. 6, 2016

(54) APPARATUS FOR DETECTING FERROMAGNETIC OBJECTS AND A PROTECTED DOORWAY ASSEMBLY

(75) Inventor: Matthew J. Wooliscroft, Worcestershire (GB)

(73) Assignee: Metrasens Limited, Worcestershire (GB)

( * ) Notice: Subject to any disclaimer, the term of this patent is extended or adjusted under 35 U.S.C. 154(b) by 610 days.

(21) Appl. No.: 13/817,779

(22) PCT Filed: Aug. 16, 2011

(86) PCT No.: PCT/GB2011/051545
§ 371 (c)(1),
(2), (4) Date: May 31, 2013

(87) PCT Pub. No.: WO2012/022971
PCT Pub. Date: Feb. 23, 2012

(65) Prior Publication Data
US 2013/0285810 A1    Oct. 31, 2013

Related U.S. Application Data

(60) Provisional application No. 61/375,619, filed on Aug. 20, 2010.

(30) Foreign Application Priority Data

Aug. 20, 2010    (GB) .................................. 1013992.1

(51) Int. Cl.
*G08B 13/24*    (2006.01)
*G08B 13/18*    (2006.01)
(Continued)

(52) U.S. Cl.
CPC ............... *G08B 21/02* (2013.01); *G01V 11/00* (2013.01); *G01R 33/288* (2013.01)

(58) Field of Classification Search
CPC ..................... G01R 33/288; G01R 31/318547;
G01R 33/072; G01R 33/091; G01R 33/12
(Continued)

(56) References Cited

U.S. PATENT DOCUMENTS 4,467,251 A * 8/1984 Jonsson ......................... 318/480
4,472,908 A * 9/1984 Wanzl et al. ..................... 49/25
(Continued)

FOREIGN PATENT DOCUMENTS

| GB | 2395276 A | 5/2004 |
| JP | 2008249584 A | 10/2008 |
| WO | 03069320 A2 | 8/2003 |

OTHER PUBLICATIONS

International Search Report for PCT/GB2011/051545 dated Dec. 19, 2012.
(Continued)

*Primary Examiner* — Emily C Terrell
(74) *Attorney, Agent, or Firm* — Honigman Miller Schwartz and Cohn LLP (57) ABSTRACT

Apparatus for detecting a ferromagnetic object to protect, for example, a doorway to an MRI room comprises a passive primary sensor apparatus comprising at least one first magnetic sensor, a secondary non-magnetic sensor apparatus comprising at least two sensors, a detection zone for one of the secondary sensors being distinct from the zone of the other one of the secondary sensors, a signal processing circuit arranged in communication with the primary and secondary sensor apparatus, and a warning device. The signal processing circuit identifies temporal variations in the signal from the primary sensor and correlate them with instances in which both sensors of the secondary, non-magnetic, sensor apparatus detect the presence of an object in their respective zones.

21 Claims, 10 Drawing Sheets

(51) Int. Cl.
*A61B 5/05* (2006.01)
*G06M 7/00* (2006.01)
*E05F 15/20* (2006.01)
*E05F 15/02* (2006.01)
*E05F 15/10* (2006.01)
*G05B 5/00* (2006.01)
*H02H 7/08* (2006.01)
*H02P 1/04* (2006.01)
*E05G 5/00* (2006.01)
*G08B 21/02* (2006.01)
*G01V 11/00* (2006.01)
*G01R 33/28* (2006.01)

(58) Field of Classification Search
USPC ...... 340/551, 541; 600/410; 250/221; 49/25, 49/26, 31; 318/480; 109/6
See application file for complete search history.

(56) References Cited

U.S. PATENT DOCUMENTS

| | | | |
|---|---|---|---|
| 4,698,937 A * | 10/1987 | Kornbrekke et al. | 49/25 |
| 5,996,281 A * | 12/1999 | Takano et al. | 49/26 |
| 6,308,644 B1 * | 10/2001 | Diaz | 109/6 |
| 7,113,092 B2 * | 9/2006 | Keene | 340/551 |
| 8,450,678 B2 * | 5/2013 | Sasaki et al. | 250/221 |
| 2003/0171669 A1 * | 9/2003 | Kopp | 600/410 |
| 2004/0041084 A1 * | 3/2004 | Carlson | G01V 8/10 250/221 |
| 2006/0158331 A1 | 7/2006 | Massengill et al. | |
| 2007/0057786 A1 * | 3/2007 | McClure | G01R 33/28 340/551 |
| 2007/0132581 A1 * | 6/2007 | Molyneaux | G01R 33/288 340/551 |
| 2007/0182550 A1 * | 8/2007 | Castello et al. | 340/541 |
| 2007/0296576 A1 * | 12/2007 | Holowick | G01R 33/28 340/539.21 |
| 2008/0231443 A1 * | 9/2008 | Kotter et al. | 340/551 |
| 2009/0167307 A1 | 7/2009 | Kopp | |
| 2010/0319256 A1 * | 12/2010 | Agam et al. | 49/31 |

OTHER PUBLICATIONS

Office Action from GB Application No. GB1013992.1 dated Dec. 17, 2010.

* cited by examiner

APPARATUS FOR DETECTING FERROMAGNETIC OBJECTS AND A PROTECTED DOORWAY ASSEMBLY

BACKGROUND

The present invention relates to apparatus for detecting the presence of ferromagnetic objects and to a protected doorway assembly for a room which include an apparatus for detecting ferromagnetic objects and in particular to a device for detecting the presence of ferromagnetic objects in the vicinity of the doorway of a room containing a magnetic resonance imagining (MRI) scanner.

In GB 2 395 276 there is taught an apparatus which is able to detect ferromagnetic objects by providing a primary sensor means comprising first and second passive magnetic sensors which detect the disturbances in the ambient magnetic field which occur as the object moves through the field. The apparatus also includes a secondary non-magnetic sensor means which detects movement of objects in the vicinity of the primary sensor means. If both the primary and secondary sensing means detect a moving object an alarm is triggered. It is proposed in that patent that the apparatus may be mounted to the wall on either side of a doorway to a room containing a magnetic resonance imaging apparatus, with the secondary sensor means being arranged to detect objects approaching or about to pass through the doorway. Because both the primary and secondary sensors must detect the object this arrangement helps to reduce false alarms.

The apparatus described above works very well to warn people who may be unintentionally about to take a ferromagnetic object into an MRI room. It is known that there have in the past been several unfortunate accidents which have occurred due to a ferrous object entering an MRI room and being magnetically propelled, at high velocity, into the MRI machine within the room. This is called the projectile effect, and is well described in GB 2 395 276.

Recently there is a trend towards providing doors within the doorway of an MRI room which open outwards, i.e. out of the room. This means that the door will pass through the zone of sensitivity of an apparatus which is located on the wall outside of the room. The door will often carry ferromagnetic items, such as door handles or lock parts, and as the door and items move through the zone the alarm may be triggered giving a false alarm. Furthermore, where the secondary sensor means comprises a light beam the door will move to block the light beam and then any ferromagnetic object within the range of the primary sensor means but not about to pass through the door will trigger a false alarm.

It has been proposed to solve this problem by placing a detection apparatus on the inside of the MRI room when an outward opening door is provided. This ensures the door does not pass through the zone of sensitivity of the secondary sensors of the apparatus. However, the applicant believes this is not a good solution. MRI rooms are subject to high levels of magnetic radiation from the MRI device, which could cause interference with the apparatus. Similarly, MRI devices are sensitive to external radiation and so the apparatus may need to be shielded to prevent it from interfering with the MRI device. It has been proposed to switch off the apparatus whenever the door is closed to ameliorate this problem but this introduces further complexity and a further source of unreliability.

Alternatively, the problem can be solved by placing the apparatus sufficiently far in front of the doorway on the outside of the room for the door not to enter the zone of sensitivity. However, this will cause the apparatus to take up a lot of space, and barriers may then be needed between the apparatus and the doorway to prevent people entering the room without passing through the zone of sensitivity. In the case of a doorway in the sidewall of a corridor it may be impractical to install the apparatus in such a manner as it would block the corridor.

BRIEF DESCRIPTION OF THE INVENTION

According to a first aspect the invention provides apparatus for detecting a ferromagnetic object, the apparatus comprising:

a passive primary sensor apparatus comprising at least one first magnetic sensor, the primary sensor apparatus adapted to measure an ambient magnetic field or gradient within a localized volume of space defined by a first zone of sensitivity of the at least one magnetic sensor, and to produce a corresponding measurement signal, secondary non-magnetic sensor apparatus comprising at least two sensors, each one being adapted to detect the presence of objects within a respective zone in the vicinity of the primary sensor apparatus, the zone for one of the secondary sensors being distinct from the zone of the other one of the secondary sensors, a signal processing circuit arranged in communication with the primary and secondary sensor apparatus, and a warning device operable by an output from the signal processing circuit, the warning device adapted to provide within the vicinity of primary sensor apparatus at least one of an audible and a visible warning, wherein the signal processing circuit is configured to identify temporal variations in the measurement signal due to the movement of a ferromagnetic object within the ambient magnetic field and to correlate the identified temporal variations in the measurement signal with instances in which both sensors of the secondary, non-magnetic, sensor apparatus detect the presence of an object in their respective zones, and to provide an output indicative of the presence of a ferromagnetic object in the vicinity of the primary sensor apparatus in the presence of a correlation there-between.

The invention is advantageous in that ferrous objects can be detected and yet, by providing two secondary sensors which each define distinct detection zones and correlating instances where both sensors detect the presence of an object in the zones (and not correlating instances where only one sensor detects an object) with the measurement from a magnetic sensor, the apparatus can be set up so as to be insensitive to the movement of certain "safe" objects through the detection zones. The alarm may be suppressed at all times when only one secondary sensor detects an object simultaneous with the primary sensing apparatus detecting a ferrous object. Provided the zones of detection of the secondary sensors are arranged such that the safe object will never enter both zones at the same time (the zones only partially overlap or do not overlap at all) the alarm will not be triggered by that object moving through the zones. In particular this allows the apparatus to be installed in regions where it would be desirable to suppress false alarms caused by the opening and closing of a door.

The signal processing circuit may include a logical AND gate which combines the output of the two secondary sensors to produce an intermediate signal which has a first logical value when one or both sensors do not detect the presence of an object in their respective zones, and a signal which has a second logical value when both secondary sensors detect the presence of an object, the signal processing circuit correlating the intermediate signal with the identified temporal variations in the measurement signal.

The secondary, non-magnetic sensor means may comprise at least one of a photo-electric sensor, a fiber-optic sensor, a passive infra-red sensor, a camera, an ultrasonic sensor, a radar sensor, an electrostatic sensor, and a millimeter wave sensor. By photo-detector we mean any detector which is able to detect incident photons, whether in the visible or non-visible spectrum.

In a preferred arrangement, at least one of the secondary sensors comprises a photo-detector and a light source which produces a beam of light that impinges on the photo-detector, the output of the photo-detector changing state when the light beam is broken, in which at least part of the path of the light beam defines the zone associated with the respective secondary sensor. Using light beams is a convenient and intuitive way of establishing the required zones of detection. The light source may produce a beam of light in the visible spectrum, or non-visible such as a beam of infra-red light.

The beams of light may be arranged to travel from the light source to the photo-detector by reflecting from a reflective surface. The reflective surface may be a retro reflector and the light source and photo-detector are located proximate one another.

In one arrangement, the secondary sensor apparatus may comprise two sensors, each comprising a photo-detector and a light source which produces a beam of light that impinges on the photo-detector, the output of the photo-detector changing state when the light beam is broken. The light beams may be aligned so that they do not overlap spatially in which case the whole of the light beam may define the zone of detection of the secondary sensor. Alternatively, the beams may overlap spatially in a region that lies outside of the respective detection zones of the two secondary sensors. When used in an environment which includes a door the beams simply need to be aligned so that the door does not pass through the region in which the beams overlap spatially.

One of the secondary sensors may comprise a doorway position sensor which include a first part that can be fixed in position relative to a doorway and a second part which can be fixed in position relative to a door in the doorway such that relative movement between the door and the doorway generates corresponding movement between the two parts of the doorway position sensor which in turn causes the output of the sensor to change indicative of the position of the door.

In use, the secondary sensing apparatus may be fixed in a position adjacent a doorway of a room to be protected, such as a doorway into a room containing an MRI machine. The zones of detection of the two secondary sensors may be arranged such that at any time and for any position of the door between fully open and fully closed the door is only detected in one of the secondary sensor zones.

For example, where both secondary sensors comprise photo-detectors which detect the breaking of light beams, each of the light beams may extend across the doorway from one side to the other. To get into the room through the doorway an object, such as a person, must break the beams. One of the beams may be reflected from a reflector located inside of the room such that with the door closed that beam is broken and with the door open that beam is not broken. The reflector may be secured to the doorway or the wall inside the room. Alternatively the reflector may be secured to the face of the door that faces into the room so that with the door open the light beam is reflected from the reflector to impinge upon the photo-detector.

The other beam may lie wholly outside (or inside) the room so that with the door closed it is not broken and with the door open the beam is broken.

The primary sensor apparatus may comprise at least two primary sensors, each sensor adapted to measure an ambient magnetic field or its gradient within a localized volume of space defined by a zone of sensitivity of the first and second magnetic sensors and to produce a corresponding measurement signal, the two sensors being secured in position with one on each side of a doorway.

An advantage of the invention, in at least one optional embodiment, is the ability to protect a doorway with an outward opening door whilst the primary and secondary sensing apparatus is located on, or adjacent, the doorframe. This allows the apparatus to be located with whole of the active parts of the apparatus outside of the room to be protected, apart from any passive parts, such as reflectors, that are required to provide the required beam path and which may be located inside of the room to be protected.

The passive primary sensor apparatus may be duplicated so that there are two passive primary sensor apparatus, each comprising at least one, and preferably first and second magnetic sensors, and each passive primary sensor apparatus adapted to measure an ambient magnetic field or gradient within a respective localized volume of space defined by a first zone of sensitivity of the first and second magnetic sensors, and each producing a corresponding measurement signal. The measurement signals may be combined using an OR gate to provide an overall measurement signal. The respective first zones may be at least partially distinct, i.e. they may overlap but not be entirely coincident. This may enable a greater overall zone to be monitored, with only one of the primary sensor means needing to detect a ferrous object.

The various component parts of the apparatus can be arranged in a variety of different ways. In one arrangement, two discrete units, which may be identical, may be provided. Each one may be identical, with each one including one of the two passive primary sensor apparatus. Each one may include an input node for receiving a signal from the secondary sensing apparatus. Each unit may include a warning device, so that the warning device is duplicated.

The, or each, magnetic sensor may separable from the signal processing circuit such that, in use, the at least one separable sensor may be disposed remotely to the signal processing means. Similarly the secondary sensing apparatus may be separable from the signal processing circuit and, optionally, the primary sensor apparatus.

The signal processing means may comprise filter means arranged to substantially reject spurious variations in the measured magnetic field. The filter means may comprise a high-pass filter and in one convenient arrangement the filter may be responsive to the measurement signal produced by the primary sensor means to attenuate variations therein having a frequency of less than 0.3 Hz.

The filter means may additionally comprise a low-pass filter which may be responsive to the measurement signal produced by the primary sensor means to attenuate variations therein having a frequency of greater than 3 Hz.

The signal processing circuit may comprise means for comparing the amplitude of the output from the filter means with an adjustable threshold level so as to indicate temporal variations in the measurement signal due to the movement of a ferromagnetic object within an ambient magnetic field.

According to a second aspect the invention provides a protected doorway assembly for a room comprising:

a doorframe housing a door, and an apparatus for detecting a ferromagnetic object located in the vicinity of the doorway, the apparatus comprising:

passive primary sensor apparatus comprising first and second magnetic sensors, the primary sensor means adapted to measure an ambient magnetic field or gradient within a localized volume of space defined by a first zone of sensitivity of the at least one magnetic sensor, and to produce a corresponding measurement signal, secondary non-magnetic sensor apparatus comprising at least two sensors, each one being adapted to detect the presence of objects within a respective zone in the vicinity of the primary sensor apparatus, the zone for one of the secondary sensors being distinct from the zone of the other one of the secondary sensors, the sensors being arranged so that as the door moves from fully closed to fully open it passes through both of the zones of the secondary sensors but is only ever detected within one zone for any given position of the door, signal processing circuit arranged in communication with the primary and secondary sensor apparatus, and a warning device operable by an output from the signal processing circuit, the warning device adapted to provide within the vicinity of primary sensor apparatus at least one of an audible and a visible warning, wherein the signal processing circuit is configured to identify temporal variations in the measurement signal due to the movement of a ferromagnetic object within the ambient magnetic field and to correlate the identified temporal variations in the measurement signal with instances in which both sensors of the secondary, non-magnetic, sensor apparatus detect the presence of an object in their respective zones, and to provide an output indicative of the presence of a ferromagnetic object in the vicinity of the primary sensor apparatus in the presence of a correlation there-between.

Conveniently, each of the secondary sensors may comprise a photo-detector and a light source which produces a beam of light that impinges on the photo-detector, the output of the photo-detector changing state when the light beam is broken, in which at least part of the path of the light beam defines the zone associated with the respective secondary sensor.

The secondary sensing apparatus may include a doorway position sensor which include a first part that is fixed in position relative to the doorway and a second part which co-operates with the door such that relative movement between the door and the doorway generates corresponding movement between the two parts of the doorway position sensor which in turn causes an output of the sensor to change indicative of the position of the door.

The doorway may, in particular, comprise the doorway to a room containing an MRI machine, and the door opens outwards from the doorway away from the room and in which the primary sensing apparatus and secondary sensing apparatus are located outside of the room.

According to a third aspect the invention provides a method of protecting a doorway of a room, such as an MRI room, comprising the steps of:

(a) Measuring an ambient magnetic field or its gradient using passive primary sensing means comprising at least a first magnetic sensor, and producing a corresponding measurement signal;

(b) Detecting the movement of objects in the vicinity of the primary sensor means using secondary non-magnetic sensor means, the secondary sensor means comprising at least two sensors, each one being adapted to detect the presence of objects within a respective zone in the vicinity of the primary sensor apparatus, the zone for one of the secondary sensors being distinct from the zone of the other one of the secondary sensors so that they do not overlap spatially.

(c) Identifying temporal variations in the measurement signal produced by the primary sensor means due to the movement of a ferromagnetic object within the ambient magnetic field within a localized volume of space defined by a zone of sensitivity of the magnetic sensor, (d) Assessing the identified temporal variations in the measurement signal in conjunction with movement of objects detected by the secondary, non-magnetic, sensor means to determine a correlation there-between, and (e) In the occurrence of such a correlation and with both the secondary sensors identifying the simultaneous presence of an object in their respective zones providing an indication of the presence of a ferromagnetic object, wherein the step of providing the indication of the presence of a ferromagnetic object comprises the step of producing within the vicinity of the primary sensor means at least one of an audible and a visible warning.

The protected door assembly may include means for preventing access to a prohibited area, operable by the output from the signal processing means. This may comprise at least one of a locking device and a barrier device.

The signal processing means comprises filter means arranged to substantially reject spurious variations in the measured magnetic field.

There will now be described, by way of example only, four embodiments of the present invention with reference to and as illustrated in the accompanying drawings in which:

DETAILED DESCRIPTION

Figure 1:
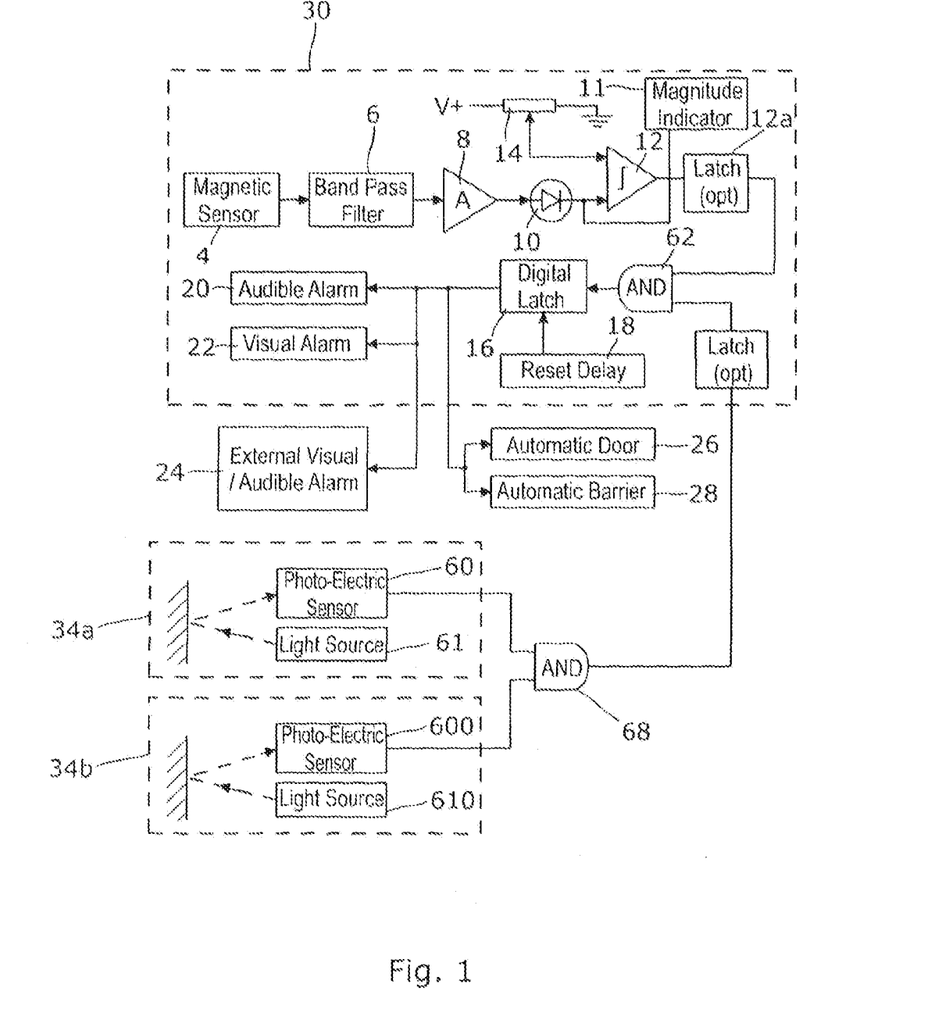
FIG. 1 is a schematic representation of a first embodiment of a doorway protection apparatus according to the present invention.

Referring to FIG. 1, a first embodiment of a ferromagnetic detection apparatus includes a primary magnetic sensor apparatus comprising a magnetic sensor 4, such as a fluxgate sensor, a magneto-resistive sensor, a magneto-impedance sensor, a Hall Effect sensor, or a galvanic coil sensor, that outputs a signal that is a measurement of the magnetic field incident upon the sensor 4 to a signal processing apparatus. Sensor 4 may be an arrangement of more than one sub-sensor such as a balanced pair or an array of magnetometers. Since the apparatus will typically be fixed in position proximate a doorway that is being protected, for most of the time the sensor will register a largely unchanging magnetic field due to the earth or where the door is an entryway to and MRI machine, the combination of the earth's magnetic field with the fringe field of the MRI's magnet. This constitutes a large offset on the output of the sensor. This constant offset can be removed using a high pass filter. The sensor will also likely measure regular changes in the magnetic field associated with the power supply for electrical equipment located near the doorway which will cause the output to vary at the supply frequency and its harmonics. This can also be filtered out using a low pass filter. The filters collectively constitute a band-pass filter 6 to perform these functions.

It is known that it takes between 0.3 seconds and 3 seconds, typically, for a person to pass through a doorway. The reciprocal of these times defines the frequencies of interest in the output of the sensor 4, i.e. 0.3 to 3 Hz.

If a ferromagnetic object carried, or pulled or pushed, by a person passes close to the sensor 4, the ambient magnetic field will be altered causing a change in the output of the sensor 4. That change will pass through the filter 6 and be amplified by an amplifier 8. In order to trigger an alarm the signal size is compared with a preset threshold. Because the signal may be positive or negative, the threshold detector consists of a rectification stage 10 followed by a comparator 12 that has a circuit 14 to provide a threshold voltage. Alternatively, separate comparators are used for positive and negative signals with the outputs combined to give a single alarm signal instead of a rectifier 10 and a single comparator 12. An optional latch 12a may be provided which holds the value of the signal output from the comparator for a predetermined period—perhaps up to 1 second.

A visual indicator 11 of the magnitude of the magnetic signal may be included. For instance, a series of amber light "bars" may be provided which are illuminated sequentially as the output signal increases in strength up to the threshold, and once the threshold is reached a red light may be illuminated. The output of the comparator may be arranged to have logic level zero for the state where the signal does not exceed the threshold, and level 'one' for the state when the signal has exceeded the threshold. Once an object has passed out of range of the sensor 4 the logic level returns to zero once the signal level has dropped below the threshold. In practice, it may be preferable that the alarm continues for an elapsed time defined by a reset delay 18 and a latch 16 such as a flip-flop that maintains the output at logic zero until the button is pressed.

The latch is used to trigger one or more warning devices such as an audible alarm 20 and a visual alarm 22. It has been found to be beneficial, although not essential, that both a visual and audible alarm are provided.

To reduce false alarms, the apparatus further includes a secondary, complimentary, non-magnetic sensor apparatus that senses when a person passes through the doorway. The secondary sensor apparatus comprises two sensors 34a, 34b. Each sensor comprises a non-magnetic sensors 60, 600 having a distinct zone of protection within which it will detect an object which is not within the zone of detection of the other sensor. These zones should, of course, lie at least in part within the region over which the primary sensing apparatus is sensitive to ferrous objects.

In the example of the first embodiment each of the non-magnetic sensors 34a, 34b comprises a photo-electric sensor (or any other device that is sensitive to incident light) which is arranged to detect when a person, or other object, passes through a beam of light directed at the sensor. The light beam may be visible or invisible. The beam of light is generated by a light source 61,610, such as an LED, associated with each photo detector 60,600. Each beam passes through a different region of space, the regions that the beams pass through defining zones of sensitivity for the respective sensors 60,600.

If a beam is unbroken, the output of the sensor 60,600 is a logical zero and if it is broken by movement of an object into the path of the beam, the output changes to a logical one level. Of course, the logic could be reversed in an alternative embodiment. The output of each sensor may be held for a period, say up to 1 second, using a latch (not shown).

The output of both sensors 60,600 is fed to a further part of the signal processing circuit. In the embodiment this comprises feeding the signals to the two inputs of a digital AND gate 68, whose output is a logical one when both beams are broken, and zero when only one beam is broken. The output of the AND gate 68 is fed to one input of a further AND gate 62 whose output is fed to the digital latch 16. The other input of the AND gate 62 is fed with the output of the magnetic sensor comparator 12. The AND gates, in use, perform a correlation function between the magnetic and non-magnetic sensor means. The two AND gates and latch together define a signal processing circuit and can be considered to provide an output whose value is dependent on a correlation between the outputs of the primary and secondary sensor apparatus.

Figure 2:
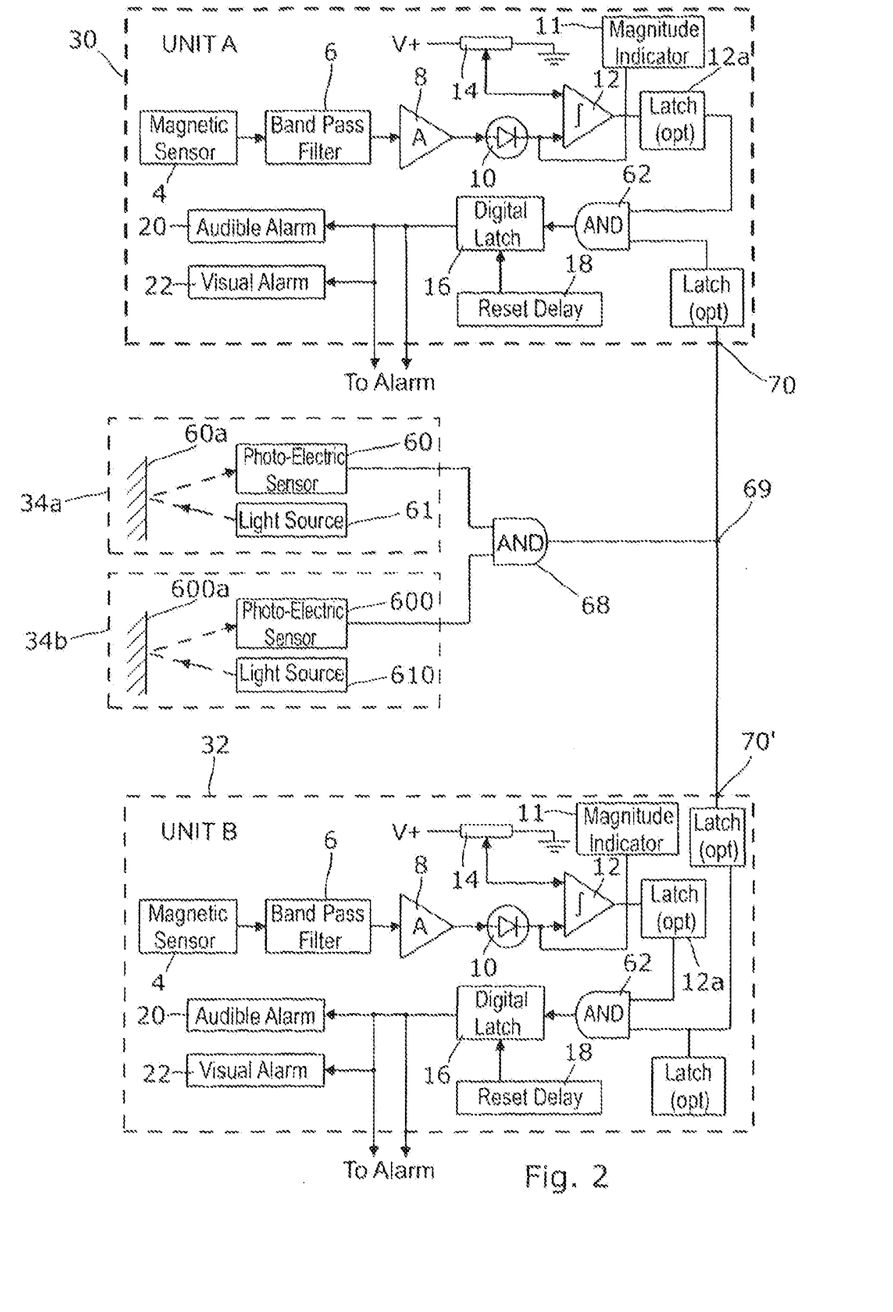
FIG. 2 is schematic representation of a second and preferred embodiment of a doorway protection apparatus of the invention.
Figure 3:
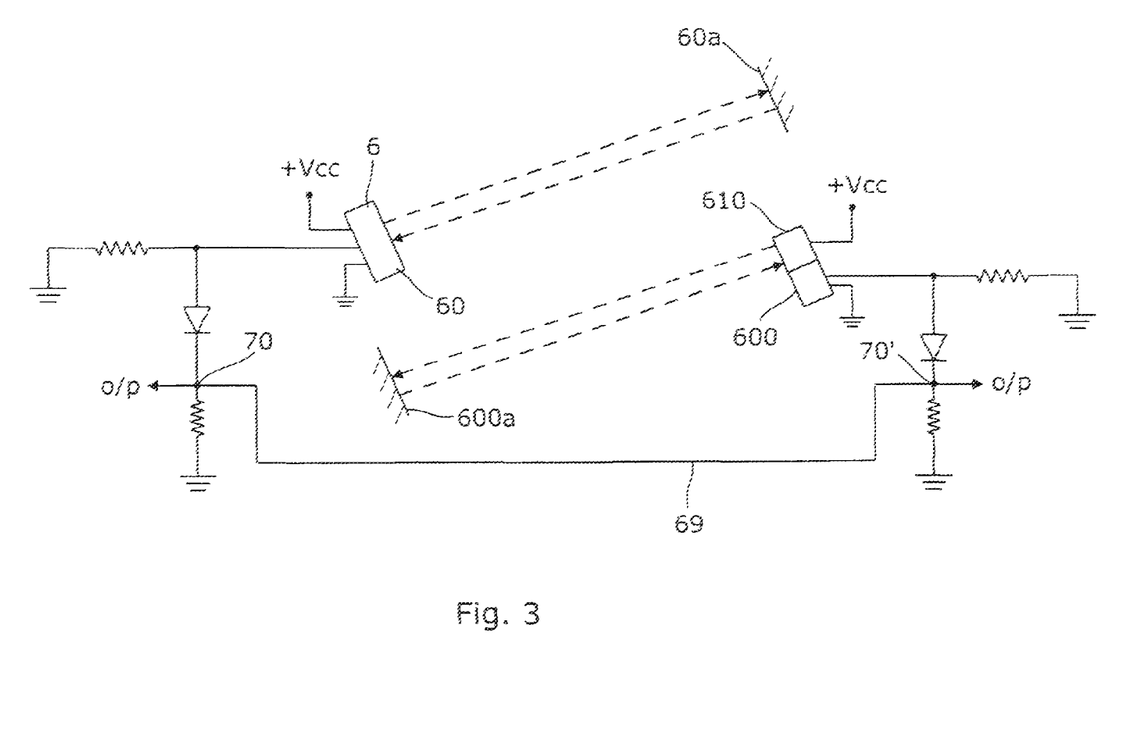
FIG. 3 is a more detailed schematic of the arrangement of the circuit of the first and second embodiments in which the secondary sensor means may be located at distributed locations and the output from the sensors is connected by a split logic AND gate over a common logic line.

In a most preferred arrangement a pair of the units shown in FIG. 1 are provided, 30, 32. This is shown in FIG. 2 of the drawings. The units 30,32 may be identical, which will simplify the manufacturing process. One unit is placed on each side of a doorway to be protected. Each produces an output signal when a ferrous object is brought into range of its sensor 4. Each unit may be located on a respective side of the door, e.g. a left side or right side of the doorway. As shown in FIG. 2, each of the units may include a point of entry for a digital line to the AND gate 62. For Unit A this point of entry is marked as point 70 in FIG. 2 and for Unit B marked as 70'. This arrangement ensures that only one of the sensors 4,44 needs to detect an object for an alarm to be raised, or when both detect an object.

Where two units 30,32 are provided the AND gate 68 may be split into two identical parts, one part forming part of Unit A and the other part of the unit B. This can be seen in FIG. 3, where the two parts are connected by a single logic line 69 which holds the logical level of the output of the AND gate. This arrangement is especially beneficial as it enables the same components to be used to construct both the units and uses very few component parts.

Figure 4:
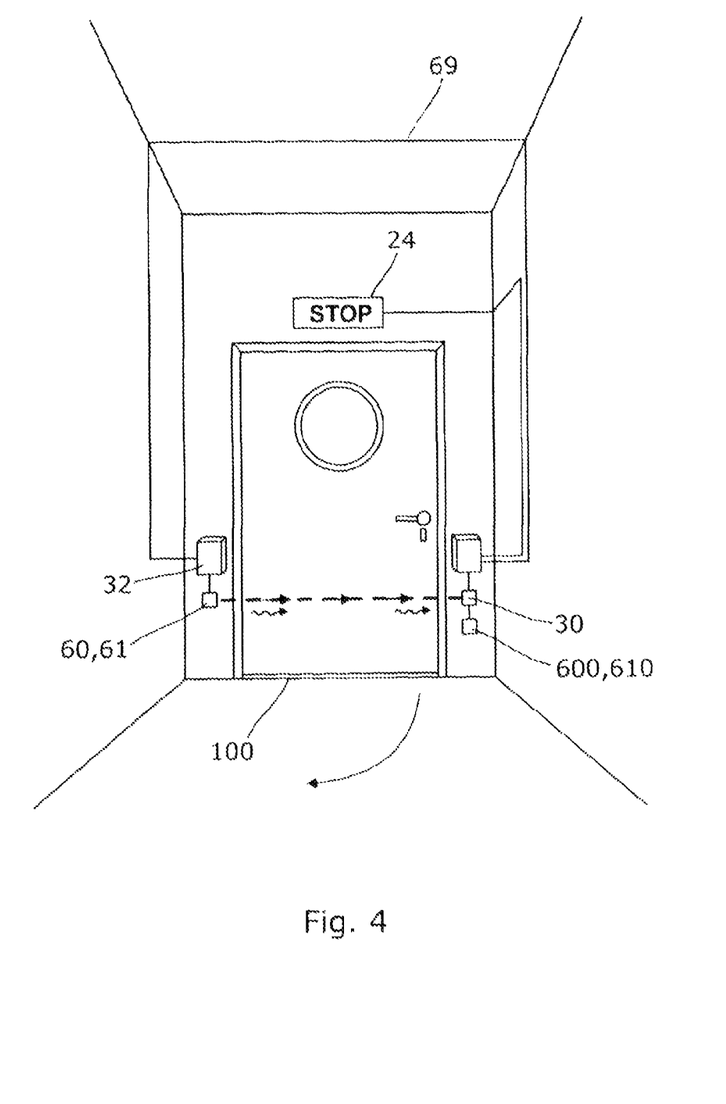
FIG. 4 illustrates the location of the apparatus on the outside wall of an MRI room with the two units located on opposing sides of a doorway to be protected, the assembly forming a protected doorway apparatus in accordance with the second aspect of the invention.

The apparatus can be used to protect a doorway, raising an alarm if a ferromagnetic object moves towards the doorway. Providing two secondary sensors 60,600 which each have a zone of sensitivity that is distinct from that of the other, the apparatus can be used to protect a wide variety of doorway layouts, and can even be used to protect a doorway in which the door opens in such a way that it would protrude into the space between the master and slave units. This would happen if the two units are located on the wall, outside of a room to be protected on opposing sides of a doorway, and in which the room is provided with an outward opening door. Such an arrangement is shown in FIG. 4, with unit 30 on the right and unit 32 on the left of the door. The door 100 is shown in a closed position, but it can be clearly seen that the door when open will stick out into the space between the two units. With a single beam protecting the door, as is known in the prior art, the door would at some point always interrupt the beam and trigger the alarm.

Of course, it would be possible to provide a system with only one beam where the two units are fixed to the wall on the inside of the room so that the one beam is not broken by the door but this has many disadvantages. In particular, in many situations it is not appropriate to place electrical equipment inside a room where there may be sensitive electrical equipment that could be affected by the signals radiated from the protection apparatus. In the case of an MRI room, one of the prime applications for a doorway protection apparatus of the present invention, the apparatus would need to be switched off during use of the MRI apparatus. This can be achieved using a door interlock mechanism but such mechanisms are inconvenient to install. Also, positioning a protection apparatus inside a room to be protected means the warning cannot be raised until after the person has passed through the doorway. It may then be too late to prevent an accident.

Figure 5:
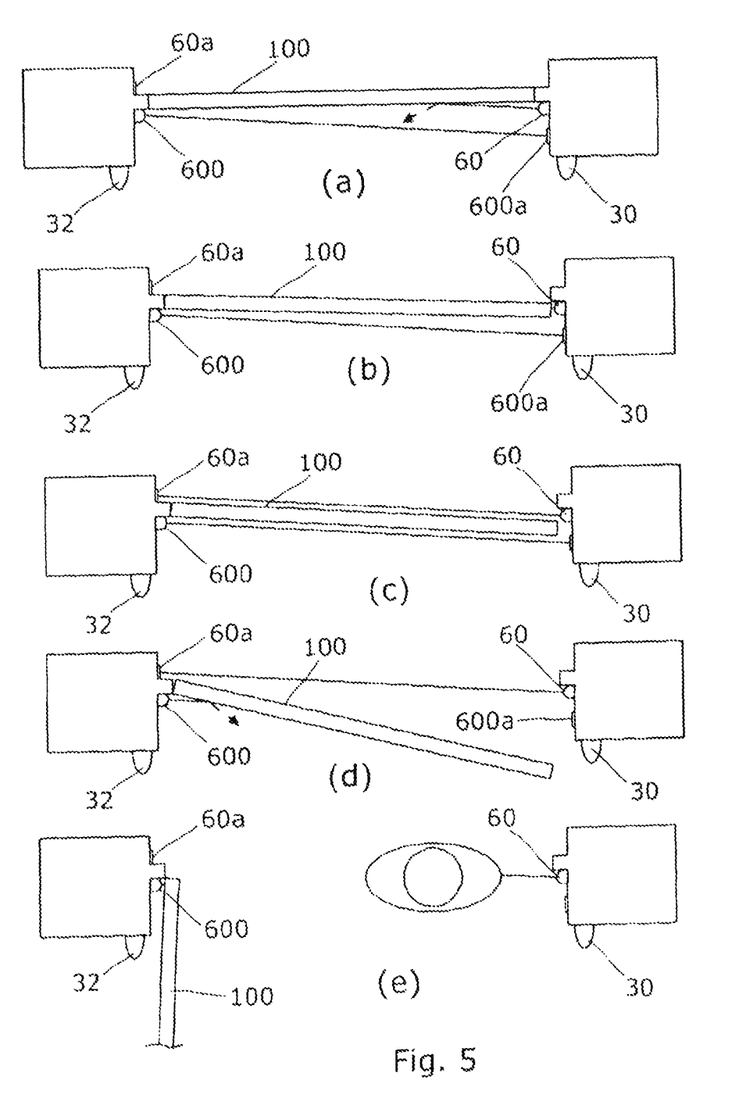
FIG. 5 is a view from above of the protected doorway apparatus of FIG. 2 showing the location of the secondary, non-magnetic, sensor means along the sides of the doors and the orientation of the light beams associated with the sensors.

To protect a door which opens outwards as shown in FIG. 4 and FIG. 5 care has to be taken to direct the beams of the two secondary sensors so that for any given position of the door only one of the beams is broken. Following the logic provided by the AND gates and OR gate, the alarm will not be raised if only one beam is broken by the door. As soon as the other beam is broken by a person or object attempting to pass through the doorway, the alarm will be raised if, at the same time, the signal processing means identifies that the magnetic sensor is also detecting a ferrous object.

If no ferrous object is detected, then no alarm is triggered and the person can safely enter the room.

One example of a suitable arrangement for the two beams that achieves the required correlation of outputs is shown in FIG. 5. As can be seen, the apparatus is arranged so that the two light sources and photo-detectors are located outside of the room and the two beams produced by the light sources shine across the doorway to strike a respective patch of retro reflective material 60*a*, 600*a* located on an opposing side of the doorway. One patch 60*a* is located in a fixed position inside the room and the other outside the room. The use of the reflective patches allows each of the two sensors 60,600 to be located adjacent its respective light source 61,610. Retro reflective patches are also easier to align than pure reflectors, and so make installation simpler compared with the use of ideal mirrored reflectors. Such retro reflectors are well known in the art and so will not be described here in detail, typically comprising an array of small mirrors or spheres which rely on total internal reflection to direct a beam of light incident upon them back to where it came from. The detector and light source can then conveniently be mounted in a single compact housing that can be fixed to the wall by the doorway. In the example shown the light sources are located on opposing sides of the doorway remote from the master and slave units. They could, if preferred, be integrated into housings for the master and slave units but this would depend on the room available to mount the master and slave units.

Both beams may lie in the horizontal plane, at around waist height or lower. They could, if preferred, by inclined from the horizontal. The important point is that both beams must extend from one side of the doorway to the other, i.e. from the left to the right side of the door, to give full protection against objects trying to pass through the door. Also, it is important that the two beams do not overlap spatially at least in a zone through which the door will pass. The zones through which the door passes represent examples of zones of detection of the secondary sensors within the context of this application. They could overlap elsewhere beyond the reach of the door.

When the door is closed, as shown in FIG. 5(*a*) the beam that is reflected from the retro reflective patch inside the room is broken but the other beam is not. When the door is fully open, as shown in FIG. 5(*d*) the beam that is reflected from the patch inside the room is then clear of the door and so that beam is no longer broken, but the beam that is reflected from the patch outside of the room is broken. Also, as the door moves from fully open to closed as shown in FIG. 5(*b*) and FIG. 5(*c*) there is no point at which both beams are broken by the door. This is possible because the two beams are substantially parallel when viewed from directly above with a gap between the two beams (in a direction orthogonal to both beams) that is wider than the thickness of the door. This ensures that as the door moves free of one beam it has not yet broken the other beam.

Ideally, the beams should be aligned such that when the door is in the small gap between the beams the door is not open far enough for an object to pass through into the room. This reduces the small, theoretical risk, that in this position an object that is too small to break both beams at once could pass through the doorway without an alarm being triggered. In a practical application this is not really a concern and can be effectively ameliorated as long as the beams are close together, say less than 10 cm apart. This would prevent a person entering around the door as they would break both beams.

With the arrangement of FIG. 5, the only way in which both beams will be broken with the door fully open is if a person, or an object, passes into the beam that is not broken by the door. This is shown in FIG. 5(*e*) for the case where the door is fully open. Breaking both beams causes the output of the AND gate to go high, and in the event that the level of the output from one of the magnetic sensors simultaneously exceeds the threshold the alarm will be triggered.

Figure 6:
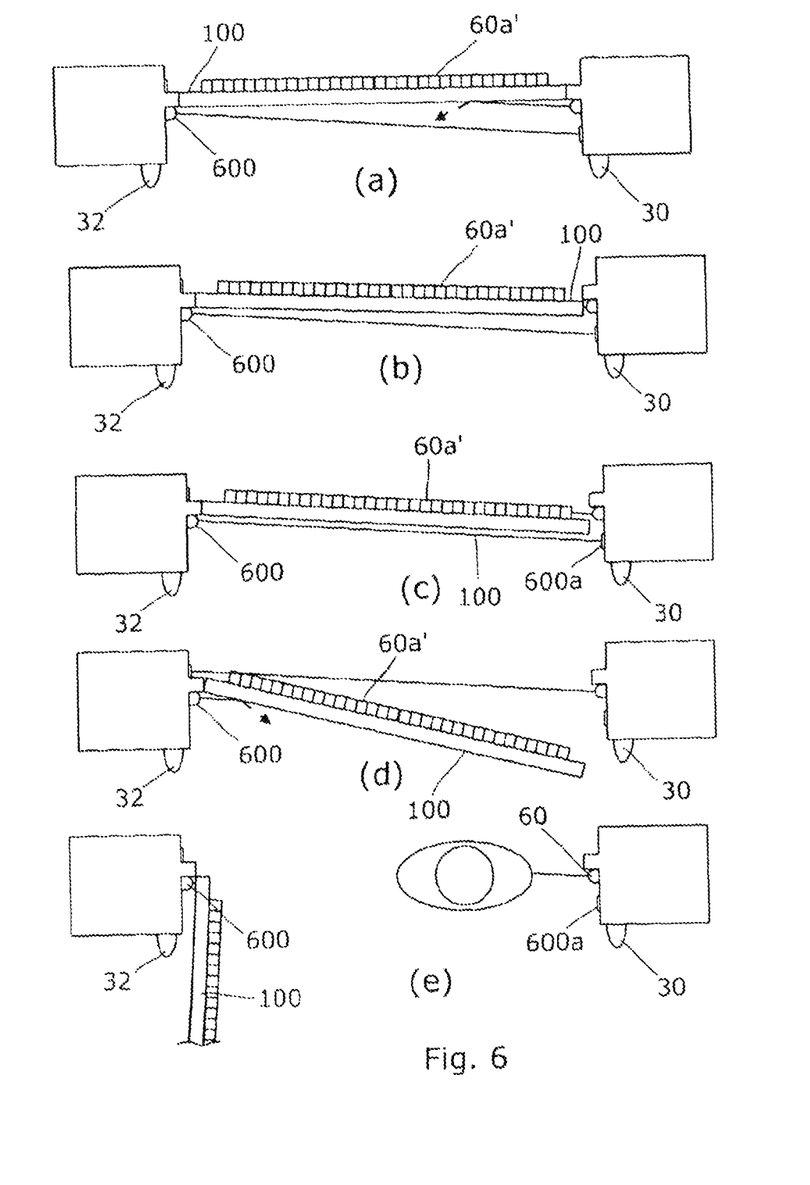
FIG. 6 is a view similar to that of FIG. 5 showing an alternative arrangement of the secondary sensing means of the apparatus of FIG. 3.

Other beam arrangements may be used with the apparatus of the first embodiment whilst remaining within the scope of the invention. FIG. 6 shows an alternative arrangement which differs from FIG. 5 in that the patch (60*a*) inside the room is replaced with a retro reflector 60*a*' on the side of the door that is inside the room. The retro reflector comprises a long strip extending right across the door from the hinged edge to the free edge, so that with the door open the beam is always reflected back to the photo detector adjacent the light source that produces the beam. Otherwise it works the same as the arrangement of Figure.

Figure 7:
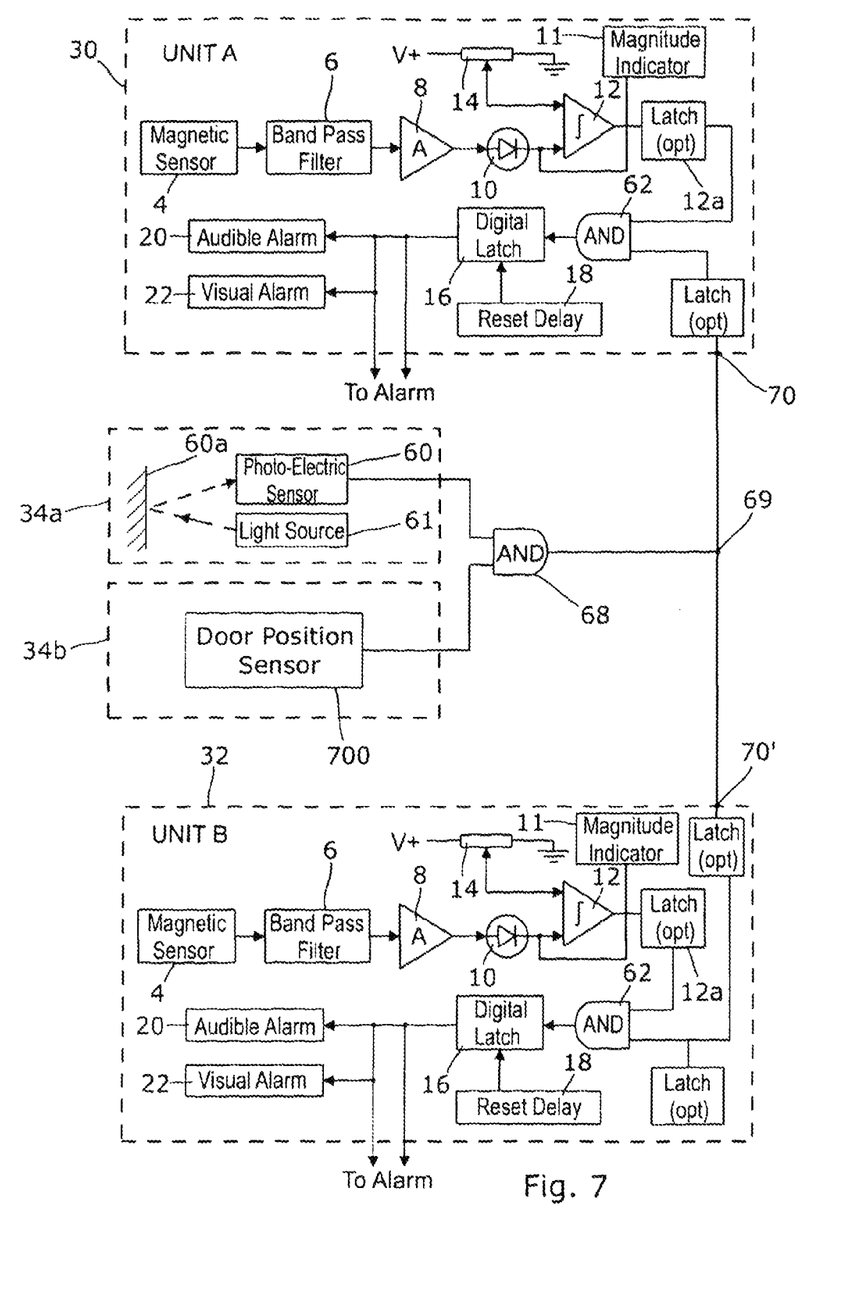
FIG. 7 is a schematic representation of a third embodiment of a doorway protection apparatus according to a first aspect of the present invention.
Figure 8:
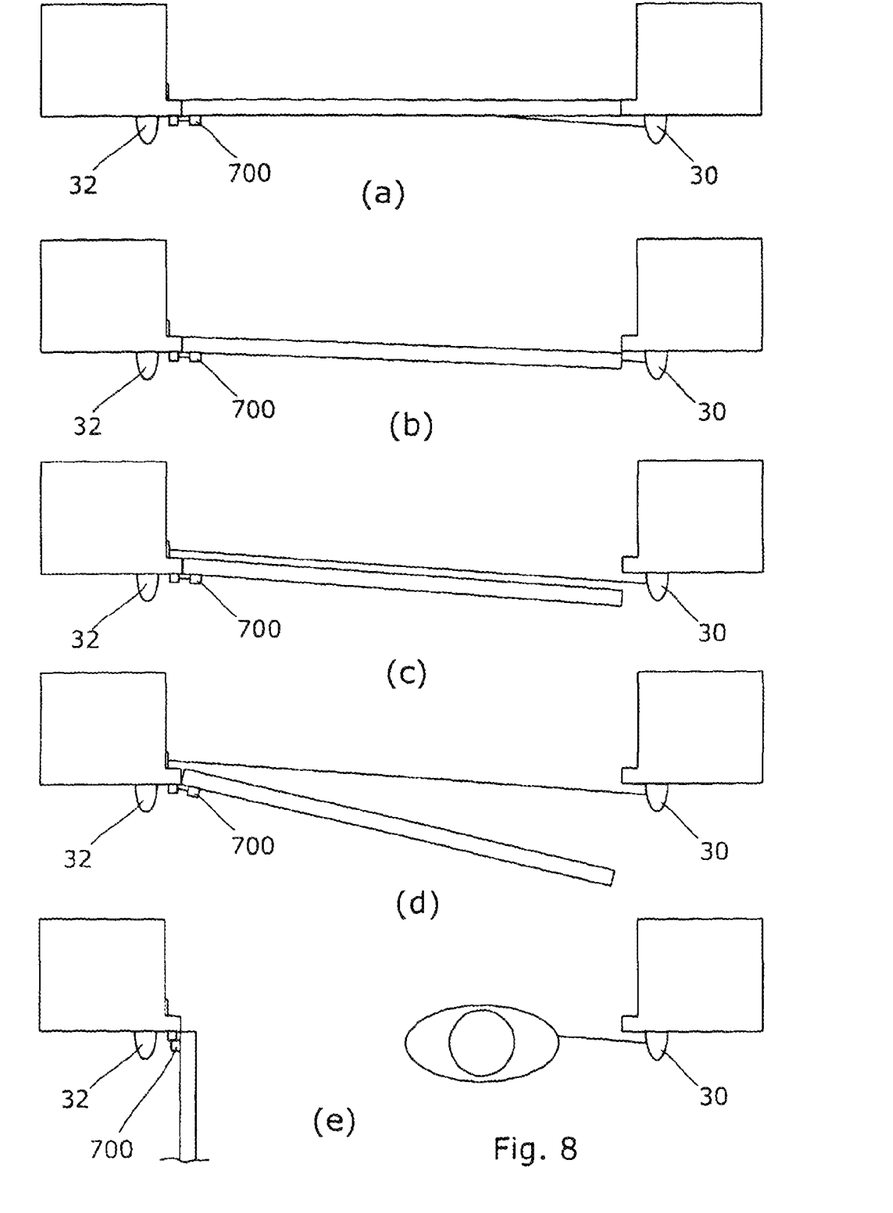
FIG. 8 is a view from above of the same doorway shown in FIGS. 4 and 5 which is protected by the apparatus illustrated in FIG. 7.
Figure 9:
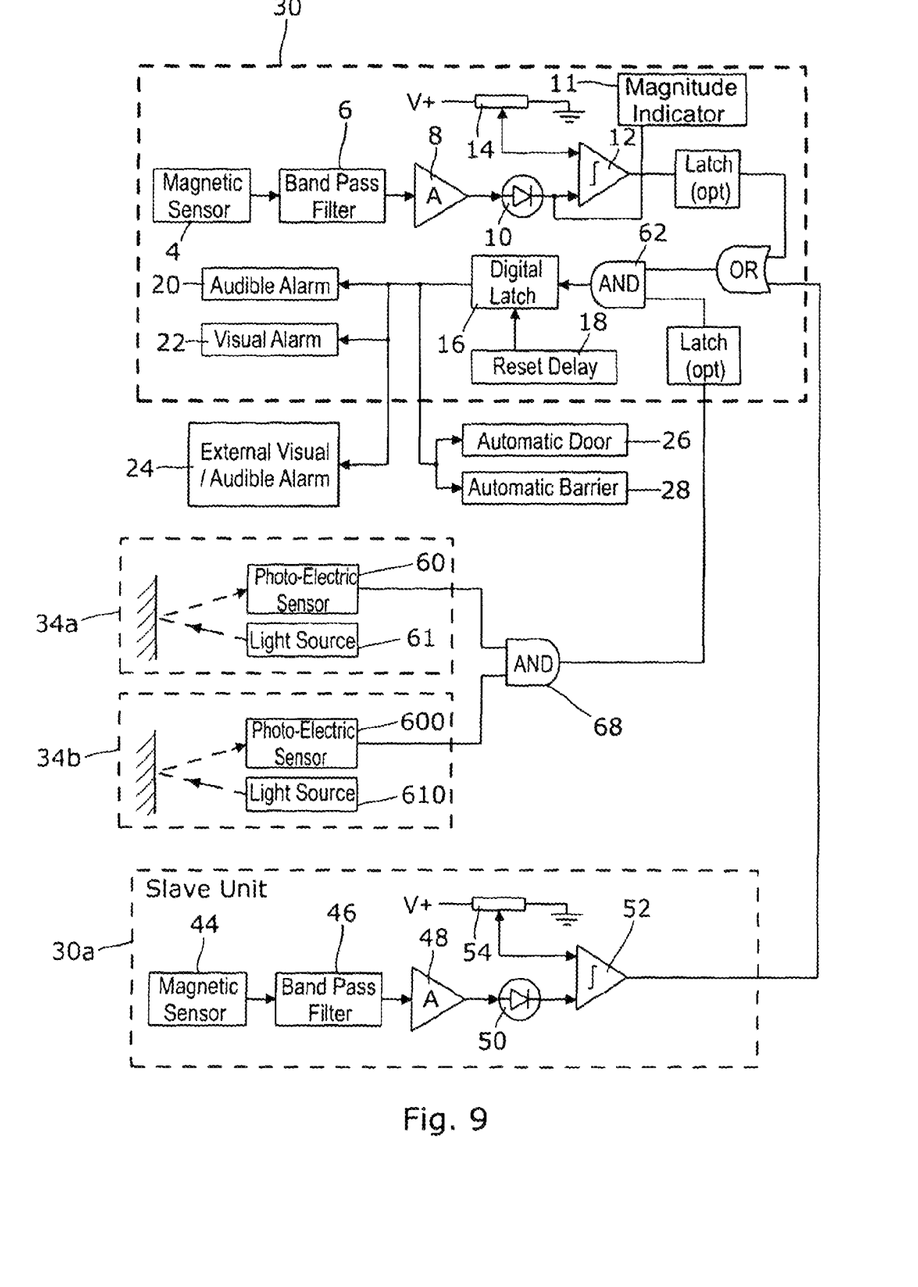
FIG. 9 is a schematic representation of a fourth embodiment of a doorway protection apparatus according to the present invention.

An alternative embodiment of a doorway protection apparatus is shown in FIG. 7, and the installation of the alternative apparatus to protect a doorway is shown in FIG. 8. Where the same parts are present in this embodiment and the first embodiment the same reference numeral have been used for clarity. The apparatus is the same as that of the first embodiment shown in FIG. 2, which uses two identical units 30, 32, except for the replacement of one of the photoelectric sensors, its light source and retro reflector, with a mechanical switch that forms a door position sensor 700. Other types of door position sensor could be used. The door position sensor produces an output signal that is fed to the AND gate 68, which has a logical low value in a first state and a logical high value in a second state.

In a position of use shown in FIG. 8, the two units 30, 32 are fixed to the wall with one on each side of the doorway in the same positions as they are for the second embodiment. The photoelectric sensor 60 detects a light beam that is reflected from a patch (60a or 60a') inside the room similar to the sensor of the first embodiment. The door position sensor 700 is secured to the doorframe and detects when the door is open or closed. It outputs the zero logic level when the door is closed or slightly open as shown in FIG. 8(a) and FIG. 8(b) and a logic one level is output when the door has opened far enough to clear the beam as shown in FIG. 8(c) and FIG. 8(d). The door position sensor can be considered to "detect" when the door is in a zone of sensitivity of the sensor corresponding to the door lying in an open position. As before, a person or object entering the room as shown in FIG. 8(e) will break the beam which will trigger the alarm if one of the magnetic sensors produces an output above the predefined threshold at the same time.

The skilled person will appreciate that various changes are possible within the scope of the present invention. For example, it is possible to construct a system in which two non-identical units are provided. One unit may be a master unit and contain the features shown in FIG. 1. The other may be a simplified slave unit 30a, which comprises only a magnetic sensor 4a and the circuitry 46a, 48a, 50a, 52a needed to produce a measurement signal. The slave unit does not contain the circuit required to perform the correlation of measurement signals which is present in the master unit 30. This measurement signal output from the slave unit is passed along a logic line 64 to the master unit. The master unit includes an additional OR gate 66, when compared with the unit in FIG. 1, which receives as its two inputs the measurement signal from its own magnetic sensor circuitry and the logic line 64. The master unit 30 will trigger and alarm if either one of the master unit 30 or slave unit 32 measure a variation in the gradient of the magnetic field and this is correlated with the detection of an object from the non-magnetic sensors 60, 610.

The use of a master and slave unit has the advantage of reducing the components needed, but the trade off is that two different units need to be produced.

Other modifications could be made. For instance, the reflectors could be omitted in some arrangements with the photo-detector and its associated light source located on opposing (left and right) sides of the doorway. Of course, this would require at least one active component (light source or photo-detector) to be located inside the room to be protected which in some cases may be acceptable.

Figure 10:
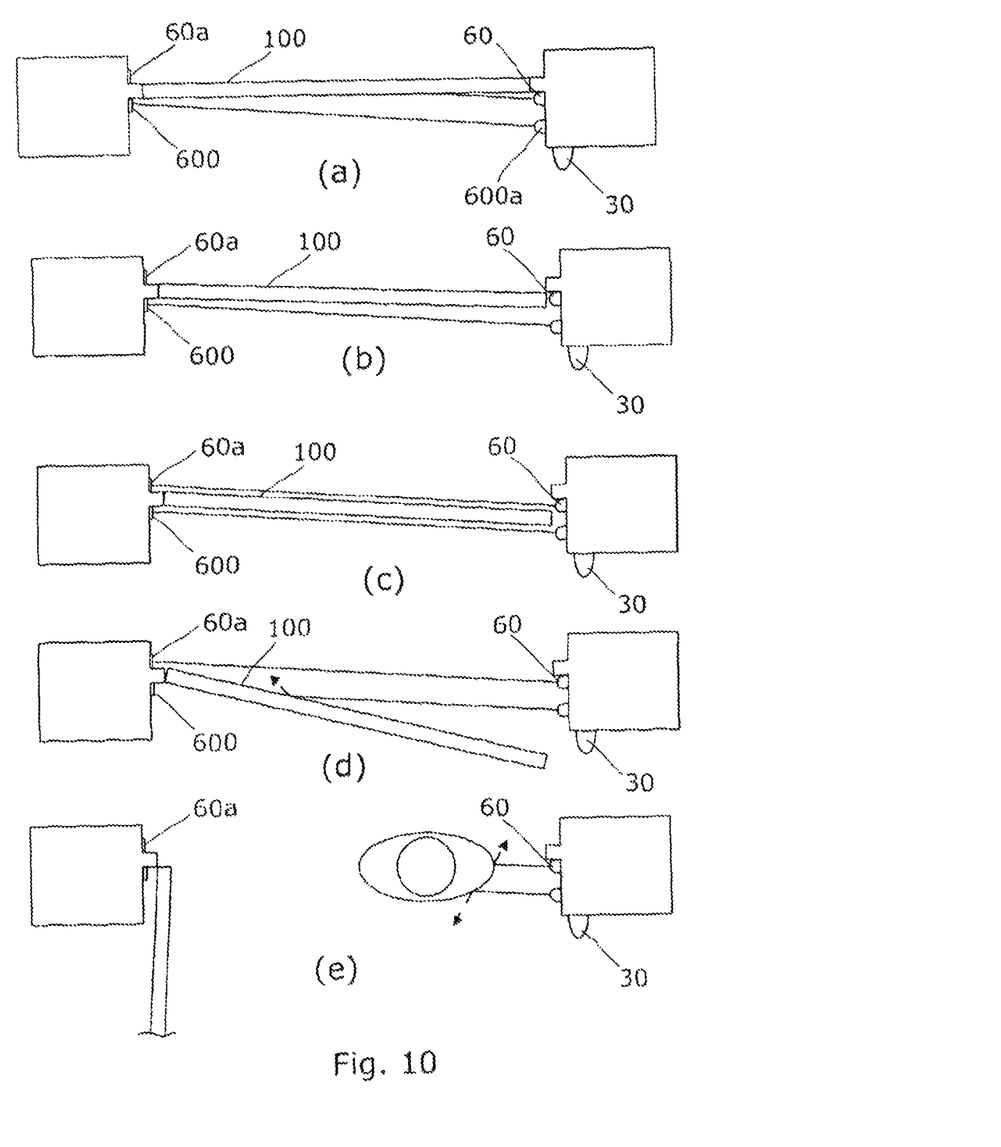
FIG. 10 is a view from above of the same doorway as FIGS. 3 and 4 protected by the apparatus of FIG. 1.

Also, it may be possible to protect a doorway using only a single unit 30 of the type shown in FIG. 1. This can be located alongside the doorway as shown in FIG. 10.

It will also be appreciated that the secondary sensing circuit could be integrated into the units 30, 32 rather than being provided as discrete units as illustrated in the Figures.

The invention is especially suitable for protecting the doorway to an MRI room where it is dangerous to introduce a ferrous object to the room. However, it could equally be used to protect doorways to other rooms. It could, if required, be used to provide protection where a doorway is not present, checking for ferrous material passing through a protected zone defined by the sensitivity of the magnetic sensors and the zones of protection of the two secondary sensors.

The invention claimed is:

1. Apparatus for detecting a ferromagnetic object in the vicinity of a doorway, the apparatus comprising:
a primary sensor apparatus comprising at least one first magnetic sensor, the primary sensor apparatus adapted to measure at least one of an ambient magnetic field and a gradient within a localized volume of space defined by a first zone of sensitivity of the at least one magnetic sensor, and to produce a corresponding measurement signal,
a secondary non-magnetic sensor apparatus comprising at least first and second secondary sensors, each one being adapted to detect the presence of objects within a respective one of a first zone or a second zone each in the vicinity of the primary sensor apparatus, the first zone for the first secondary sensor being distinct from the second zone for the second secondary sensor,
a signal processing circuit arranged in communication with the primary sensor apparatus and the secondary non-magnetic sensor apparatus, and
a warning device operable by an output from the signal processing circuit, the warning device adapted to provide within the vicinity of said primary sensor apparatus at least one of an audible and a visible warning,
wherein the signal processing circuit is configured to identify temporal variations in the measurement signal due to the movement of a ferromagnetic object within the ambient magnetic field and to correlate the identified temporal variations in the measurement signal with instances in which both sensors of the secondary, non-magnetic, sensor apparatus detect the presence of an object in their respective first and second zones, and to provide an output indicative of the presence of a ferromagnetic object in the vicinity of the primary sensor apparatus in the presence of a correlation therebetween, and wherein, when a door in the doorway moves from fully closed to fully open, the moving door first passes entirely through the first zone for the first secondary sensor and subsequently enters the second zone for the second secondary sensor only after the presence of the door exits the first zone and remains within the second zone while moving to fully open.

2. Apparatus according to claim 1 in which the signal processing circuit includes a logical AND gate which combines the output of the first and second secondary sensors to produce an intermediate signal which has a first logical value when one or both sensors do not detect the presence of an object in their respective zones, and a signal which has a second logical value when both secondary sensors detect the presence of an object, the signal processing circuit correlating the intermediate signal with the identified temporal variations in the measurement signal.

3. Apparatus according to claim 1 in which at least one of the secondary sensors comprises a photo-detector and a light source which produces a beam of light that impinges on the photo-detector, the output of the photo-detector changing state when the light beam is broken, in which at least part of the path of the light beam defines the respective first or second zone associated with the respective secondary sensor.

4. Apparatus according to claim 3 in which the beam of light travels from the light source to the photo-detector by reflecting from a reflective surface.

5. Apparatus according to claim 3 in which the secondary sensor apparatus comprises the first secondary sensor and the second secondary sensor, each comprising a photo-detector and a light source which produces a beam of light that impinges on the photo-detector, the output of the photo-detector changing state when the light beam is broken, in which the light beams do not overlap spatially and in which the whole of the light beam defines the first zone of detection of the second secondary sensor, or in which the beams overlap spatially in a region that lies outside of the respective first and second zones of detection of the first and second secondary sensors.

6. Apparatus according to claim 5 in which the reflective surface is a retro reflector and the light source and photo-detector are located proximate one another.

7. Apparatus according to claim 1 in which one of the secondary sensors comprises a doorway position sensor which include a first part that can be fixed in position relative to the doorway and a second part which can be fixed in position relative to the door in the doorway such that relative movement between the door and the doorway generates corresponding movement between the two parts of the doorway position sensor which in turn causes the output of the sensor to change indicative of the position of the door.

8. Apparatus according to claim 1 in which the secondary sensing apparatus is secured in a fixed position adjacent the doorway of a room to be protected, and in which the zones of detection of the first and second secondary sensors are arranged such that at any time and for any position of the door between fully open and fully closed the door is only detected in one of the first zone of detection or the second zone of detection.

9. Apparatus according to claim 8 in which the light beam associated with the first secondary sensor extends across the doorway and is reflected from a reflector located inside of the room such that with the door closed that beam is broken and with the door open that beam is not broken.

10. Apparatus according to claim 9 in which the reflector is secured to the doorway or the wall inside the room.

11. Apparatus according to claim 9 in which the reflector is secured to the face of the door that faces into the room so that with the door open the light beam is reflected from the reflector to impinge upon the photo-detector.

12. Apparatus according to claim 1 in which the primary sensor apparatus comprises at least two primary sensors, each sensor adapted to measure an ambient magnetic field or its gradient within a localized volume of space defined by a zone of sensitivity of the first and second magnetic sensors and to produce a corresponding measurement signal, the two sensors being secured in position with one on each side of the doorway.

13. Apparatus according to claim 1 in which the whole of the active parts of the apparatus are located outside of a room to be protected.

14. Apparatus according to claim 1 in which the primary magnetic sensor apparatus is one or more of a magnetometer, gradiometer and a magnetic sensing array.

15. A protected doorway assembly for a room comprising:
a doorframe housing a door, and
an apparatus for detecting a ferromagnetic object located in the vicinity of the doorway, the apparatus comprising:
passive primary sensor apparatus comprising first and second magnetic sensors, the primary sensor means adapted to measure an ambient magnetic field or gradient within a localized volume of space defined by a first zone of sensitivity of the at least one magnetic sensor, and to produce a corresponding measurement signal,
secondary non-magnetic sensor apparatus comprising at least first and second secondary sensors, each one being adapted to detect the presence of objects within a respective one of a first zone or a second zone each in the vicinity of the primary sensor apparatus, the first zone for the first secondary sensor being distinct from the second zone for the second secondary sensor,
signal processing circuit arranged in communication with the primary and secondary sensor apparatus, and
a warning device operable by an output from the signal processing circuit, the warning device adapted to provide within the vicinity of primary sensor apparatus at least one of an audible and a visible warning,
wherein the signal processing circuit is configured to identify temporal variations in the measurement signal due to the movement of a ferromagnetic object within the ambient magnetic field and to correlate the identified temporal variations in the measurement signal with instances in which both sensors of the secondary, non-magnetic, sensor apparatus detect the presence of an object in their respective first and second zones, and to provide an output indicative of the presence of a ferromagnetic object in the vicinity of the primary sensor apparatus in the presence of a correlation therebetween, and wherein, when the door in the doorway moves from fully closed to fully open, the moving door first passes entirely through the first zone for the first secondary sensor and subsequently enters the second zone for the second secondary sensor only after the presence of the door exits the first zone and remains within the second zone while moving to fully open.

16. A protected doorway assembly according to claim 15 in which each of the secondary sensors comprises a photo-detector and a light source which produces a beam of light that impinges on the photo-detector, the output of the photo-detector changing state when the light beam is broken, in which at least part of the path of the light beam defines the respective one of the first zone or the second zone associated with the respective secondary sensor.

17. A protected doorway assembly according to claim 15 in which the secondary sensing apparatus includes a doorway position sensor which include a first part that is fixed in position relative to the doorway and a second part which co-operates with the door such that relative movement between the door and the doorway generates corresponding movement between the two parts of the doorway position sensor which in turn causes an output of the sensor to change indicative of the position of the door.

18. A protected doorway assembly according to claim 15 in which the signal processing circuit combines the output from the secondary sensors using a logical AND gate to produce an intermediate signal which has a first logical value when one or both sensors do not detect the presence of an object in their respective first and second zones, and a signal which has a second logical value when both secondary sensors detect the presence of an object, the signal processing means correlating the intermediate signal with the identified temporal variations in the measurement signal.

19. A protected doorway assembly according to claim 15 in which the doorway comprises the doorway to a room containing an MRI machine, and the door opens outwards from the doorway away from the room and in which the primary sensing apparatus and secondary sensing apparatus are located outside of the room.

20. A method of protecting a doorway of a room, comprising the steps of:
(a) Measuring an ambient magnetic field or its gradient using passive primary sensing means comprising at least a first magnetic sensor, and producing a corresponding measurement signal;
(b) Detecting the movement of objects in the vicinity of the primary sensor means using secondary non-magnetic sensor means, the secondary sensor means comprising at least first and second secondary sensors, each one being adapted to detect the presence of objects within a respective one of a first zone or a second zone each in the vicinity of the primary sensor apparatus, the first zone for the first secondary sensor being distinct from the second zone for the second secondary sensor so that they do not overlap spatially,
(c) Identifying temporal variations in the measurement signal produced by the primary sensor means due to the movement of a ferromagnetic object within the ambient magnetic field within a localized volume of space defined by a zone of sensitivity of the magnetic sensor,
(d) Assessing the identified temporal variations in the measurement signal in conjunction with movement of objects detected by the secondary, non-magnetic, sensor means to determine a correlation there-between, and
(e) In the occurrence of such a correlation and with both the secondary sensors identifying the simultaneous presence of an object in their respective first and second zones providing an indication of the presence of a ferromagnetic object,
wherein the step of providing the indication of the presence of a ferromagnetic object comprises the step of producing within the vicinity of the primary sensor means at least one of an audible and a visible warning, and wherein, when a door in the doorway moves from fully closed to fully open, the moving door first passes entirely through the first zone for the first secondary sensor and subsequently enters the second zone for the second secondary sensor only after the presence of the door exits the first zone and remains within the second zone while moving to fully open.

21. A method according to claim 20 in which steps (a) and (b) comprise measuring and detecting using primary and secondary sensors located outside of the room to be protected.

* * * * *